(12) United States Patent
Seo et al.

(10) Patent No.: US 11,861,123 B2
(45) Date of Patent: Jan. 2, 2024

(54) TOUCH SENSOR AND DISPLAY DEVICE INCLUDING THE SAME

(71) Applicant: Samsung Display Co., Ltd., Yongin-si (KR)

(72) Inventors: Su Yul Seo, Yongin-si (KR); Yu Jin Choi, Yongin-si (KR); Yeon Ju Kang, Yongin-si (KR); Ki Hyuk Kim, Yongin-si (KR); Gyeong Nam Bang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/666,479

(22) Filed: Feb. 7, 2022

(65) Prior Publication Data

US 2022/0164067 A1    May 26, 2022

Related U.S. Application Data

(63) Continuation of application No. 15/852,422, filed on Dec. 22, 2017, now Pat. No. 11,243,647.

(30) Foreign Application Priority Data

Dec. 26, 2016   (KR) .......................... 10-2016-0179510

(51) Int. Cl.
*G06F 3/041* (2006.01)
*H10K 59/40* (2023.01)
(Continued)

(52) U.S. Cl.
CPC .......... *G06F 3/0446* (2019.05); *G06F 3/0412* (2013.01); *G06F 3/0443* (2019.05);
(Continued)

(58) Field of Classification Search
CPC .................................................. G06F 3/04164
See application file for complete search history.

(56) References Cited

U.S. PATENT DOCUMENTS 8,203,539 B2   6/2012   Kim et al.
8,619,039 B2   12/2013  Yang et al.
(Continued)

FOREIGN PATENT DOCUMENTS

KR   10-0835008   6/2008
KR   10-1133492   4/2012
(Continued)

OTHER PUBLICATIONS

Non-Final Office Action dated Feb. 1, 2019, in U.S. Appl. No. 15/852,422.
(Continued)

*Primary Examiner* — Towfiq Elahi
*Assistant Examiner* — Bipin Gyawali
(74) *Attorney, Agent, or Firm* — H.C. Park & Associates, PLC

(57) ABSTRACT

A touch sensor includes a substrate, an insulating layer, a sensor, and sensing lines. The substrate includes: a sensing region, and a peripheral region at a periphery of the sensing region. The insulating layer is on the substrate. The insulating layer includes contact holes. The sensor is on the substrate and overlaps the sensing region. The sensing lines are on the substrate and overlap the peripheral region. The sensing lines are connected to the sensor. Each of the sensing lines is formed as a multilayer structure. The multilayer structure includes a first electrically conductive layer on the substrate, and a second electrically conductive layer connected to the first electrically conductive layer via a contact hole among the contact holes. Widths of the sensing lines are different from one another.

10 Claims, 8 Drawing Sheets

(51) Int. Cl.
- *H10K 59/123* (2023.01)
- *H10K 59/131* (2023.01)
- *H10K 59/121* (2023.01)
- *G06F 3/044* (2006.01)
- *G06F 1/03* (2006.01)
- *H01L 27/12* (2006.01)

(52) U.S. Cl.
CPC ....... *G06F 3/04164* (2019.05); *H10K 59/123* (2023.02); *H10K 59/1213* (2023.02); *H10K 59/131* (2023.02); *H10K 59/40* (2023.02); *G06F 2203/04103* (2013.01); *G06F 2203/04111* (2013.01); *G06F 2203/04112* (2013.01); *H01L 27/124* (2013.01)

(56) References Cited

U.S. PATENT DOCUMENTS

| | | | |
|---|---|---|---|
| 8,847,932 | B2 | 9/2014 | Kang et al. |
| 9,069,418 | B2 | 6/2015 | Grunthaner et al. |
| 9,871,082 | B2 | 1/2018 | Jeon |
| 10,942,590 | B2 | 3/2021 | Jeong et al. |
| 2009/0262095 | A1 | 10/2009 | Kinoshita et al. |
| 2015/0062454 | A1 | 3/2015 | Hao et al. |
| 2016/0202833 | A1 | 7/2016 | Kim et al. |
| 2017/0097727 | A1 | 4/2017 | Wu et al. |
| 2017/0193876 | A1* | 7/2017 | Choi ..................... G09G 3/2003 |
| 2018/0006265 | A1* | 1/2018 | Oh ....................... H10K 59/131 |
| 2018/0061898 | A1 | 3/2018 | Oh et al. |
| 2018/0145121 | A1* | 5/2018 | Park ..................... H10K 59/122 |
| 2019/0131572 | A1* | 5/2019 | Gwon ................ H01L 51/5246 |

FOREIGN PATENT DOCUMENTS

| | | |
|---|---|---|
| KR | 10-1154802 | 6/2012 |
| KR | 10-2012-0110887 | 10/2012 |
| KR | 10-1226334 | 1/2013 |
| KR | 10-1336525 | 12/2013 |
| KR | 10-1501901 | 3/2015 |

OTHER PUBLICATIONS

Final Office Action dated Jun. 28, 2019, in U.S. Appl. No. 15/852,422.
Non-Final Office Action dated Nov. 21, 2019, in U.S. Appl. No. 15/852,422.
Final Office Action dated May 12, 2020, in U.S. Appl. No. 15/852,422.
Non-Final Office Action dated Oct. 20, 2020, in U.S. Appl. No. 15/852,422.
Final Office Action dated Mar. 12, 2021, in U.S. Appl. No. 15/852,422.
Notice of Allowance dated Oct. 4, 2021, in U.S. Appl. No. 15/852,422.

* cited by examiner

TOUCH SENSOR AND DISPLAY DEVICE INCLUDING THE SAME

CROSS-REFERENCE TO RELATED APPLICATIONS

This application is a Continuation of U.S. patent application Ser. No. 15/852,422, filed Dec. 22, 2017, which issued as U.S. Pat. No. 11,243,647, which claims priority to and the benefit of Korean Patent Application No. 10-2016-0179510, filed Dec. 26, 2016, each of which is hereby incorporated by reference for all purposes as if fully set forth herein.

BACKGROUND

Field

The disclosure generally relates to a touch sensor and a display device including the same.

Discussion

A touch sensor is an input device that enables a command of a user to be input by selecting an instruction associated with content displayed on a screen of a display device or the like with an input tool, e.g., a hand of the user, an object, a stylus, etc. In general, the touch sensor may include touch electrodes, sensing lines connected to the touch electrodes, and a pad unit connected to the sensing lines so that a touch event generated in a sensing region can be recognized as an input signal.

Meanwhile, in the touch sensor, the sensing lines may have different line lengths depending on positions of the touch electrodes. In particular, when the sensing lines have the same line width, a difference in line resistance between sensing lines may occur due to different line lengths. As the difference in line resistance between the sensing lines increases and distorts a signal for sensing the touch event, the difference in line resistance between the sensing lines may act as a factor that disturbs accurate detection of a touch event.

The above information disclosed in this section is only for understanding the background of the inventive concepts, and, therefore, may contain information that does not form prior art.

SUMMARY

Some exemplary embodiments are capable of providing a touch sensor having a uniform touch recognition rate.

Some exemplary embodiments are capable of providing a display device including a touch sensor having a uniform touch recognition rate.

Additional aspects will be set forth in the detailed description which follows, and, in part, will be apparent from the disclosure, or may be learned by practice of the inventive concepts.

According to some exemplary embodiments, a touch sensor includes a substrate, an insulating layer, a sensor, and sensing lines. The substrate includes a sensing region, and a peripheral region at a periphery of the sensing region. The insulating layer is on the substrate. The insulating layer includes contact holes. The sensor is on the substrate and overlaps the sensing region. The sensing lines are on the substrate and overlap the peripheral region. The sensing lines are connected to the sensor. Each of the sensing lines is formed as a multilayer structure. The multilayer structure includes a first electrically conductive layer on the substrate, and a second electrically conductive layer connected to the first electrically conductive layer via a contact hole among the contact holes. Widths of the sensing lines are different from one another.

According to some exemplary embodiments, a display device includes a first base substrate, a thin film transistor, a light emitting device, and a touch sensor. The first base substrate includes a display region, and a non-display region at the periphery of the display region. The thin film transistor is on the first base substrate and overlaps the display region. The light emitting device is connected to the thin film transistor. The touch sensor is on a surface of the first base substrate. The touch sensor is configured to sense a position of a touch interaction. The touch sensor includes a second base substrate, an insulating layer, a sensor, and sensing lines. The second base substrate includes a sensing region corresponding to the display region, and a peripheral region at a periphery of the sensing region. The insulating layer is on the second base substrate. The insulating layer includes contact holes. The sensor is on the second base substrate and overlaps the sensing region. The sensing lines are on the second base substrate and overlap the peripheral region. The sensing lines are connected to the sensor. Each of the sensing lines is formed as a multilayer structure. The multilayer structure includes a first electrically conductive layer on the second base substrate, and a second electrically conductive layer connected to the first electrically conductive layer via a contact hole among the contact holes. Widths of the sensing lines are different from one another.

According to some exemplary embodiments, a touch sensor includes a substrate, a sensor, and sensing lines. The substrate includes a sensing region, and a peripheral region outside the sensing region. The sensor is on a surface of the substrate and overlaps the sensing region. The sensing lines are on the surface of the substrate and overlap the peripheral region. The sensing lines are connected to the sensor. Each of the sensing lines is formed as a multilayer structure. In a direction normal to the surface, a width of each multilayer structure varies between a first width and a second width different from the first width. First widths of the sensing lines are different from one another.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
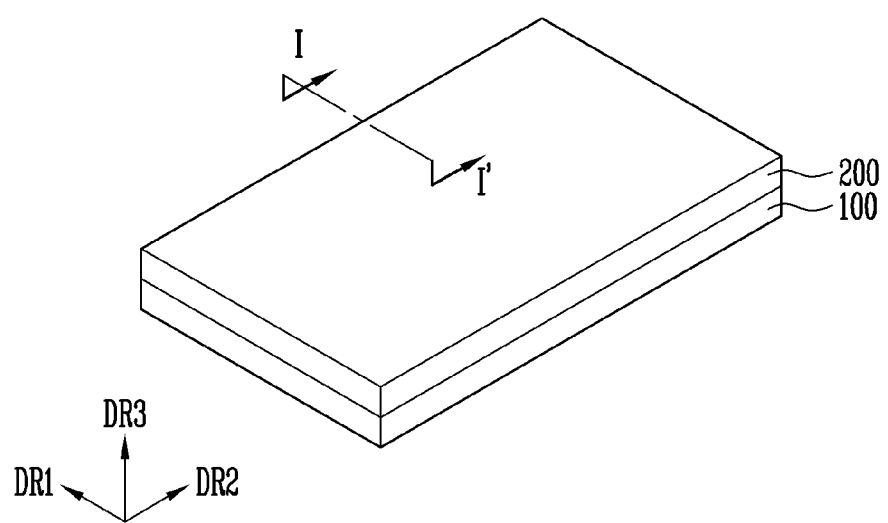
FIG. 1 is a perspective view illustrating a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
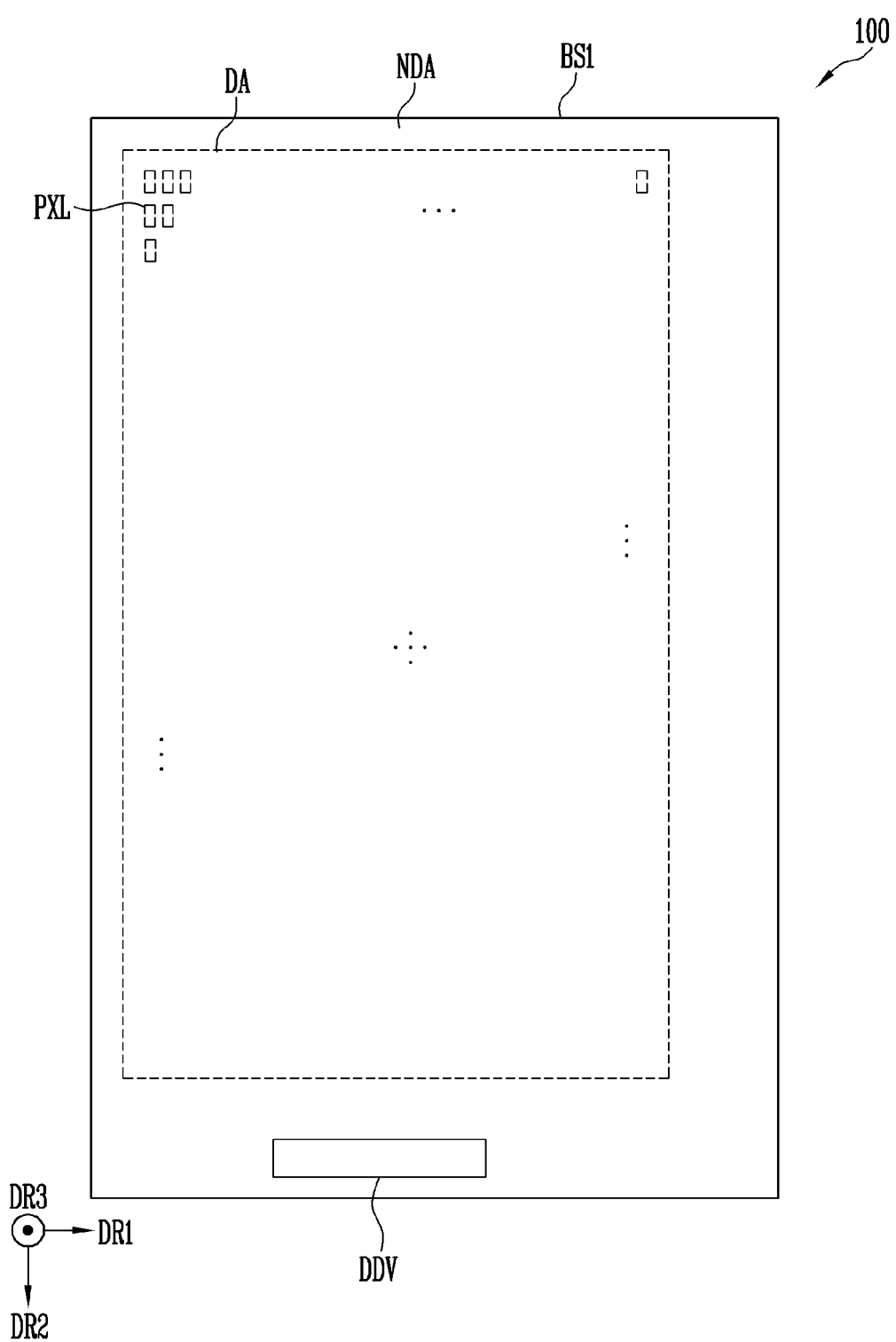
FIG. 2 is a plan view illustrating a display panel of the display device of FIG. 1 according to some exemplary embodiments.
Figure 3:
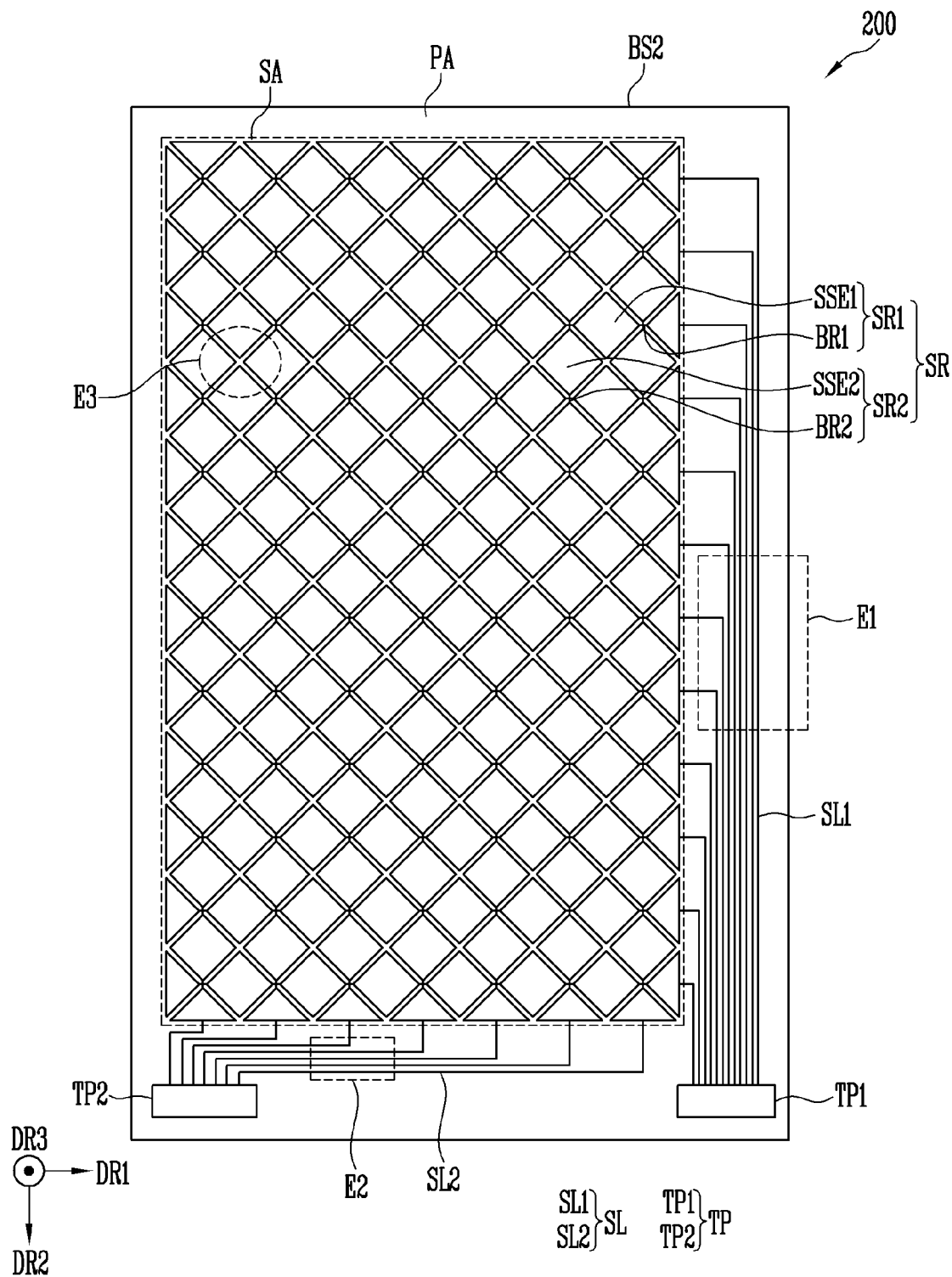
FIG. 3 is a plan view illustrating a touch sensor of the display device of FIG. 1 according to some exemplary embodiments.

FIG. 1 is a perspective view illustrating a display device according to some exemplary embodiments. FIG. 2 is a plan view illustrating a display panel of the display device of FIG. 1 according to some exemplary embodiments. FIG. 3 is a plan view illustrating a touch sensor of the display device of FIG. 1 according to some exemplary embodiments.

Referring to FIGS. 1 to 3, a display device may be provided in various shapes. For example, the display device may be provided in a quadrangular plate shape having two pairs of sides parallel to each other. When the display device is provided in the rectangular plate shape, any one pair of sides among the two pairs of sides may be provided longer than the other pair of sides. For illustrative and descriptive convenience, a case where the display device has a pair of long sides and a pair of short sides is provided. In this case, the extending direction of the short side is represented as a first direction DR1, the extending direction of the long side is represented as a second direction DR2, and the extending direction of a thickness is represented as a third direction DR3.

The display device may include a display panel 100 provided with display elements (not shown) that display an image, and a touch sensor 200 that recognizes a touch.

The display device may include a display region DA in which an image generated via the display panel 100 is displayed, a non-display region NDA provided at, at least one side of the display region DA, a sensing region SA in which a touch interaction of a user on or near the touch sensor 200 and/or a pressure of the touch interaction is sensed, and a peripheral region PA provided at, at least one side of the sensing region SA. The sensing region SA may overlap with the display region DA. The sensing region SA may have an area substantially equal to or larger than that of the display region DA. For convenience, the sensing region SA will be described as corresponding to the display region DA. A touch interaction may include actual contact with the display device in association with the sensing region SA, a hovering interaction over the sensing region SA, an approach of a touch interaction with the sensing region SA, and/or the like. For descriptive convenience, a touch interaction will generally be referred to as a touch.

The display panel 100 may display arbitrary visual information, e.g., a text, a video, a picture, a two-dimensional or three-dimensional image, etc. Hereinafter, the arbitrary visual information is referred to as an "image," however, the kind of the display panel 100 is not limited to ones that display images.

The display panel 100 may include a first base substrate BS1 including the display region DA and the non-display region NDA. Here, the display region DA is located at a central portion of the display panel 100, and may have a relatively large area as compared with the non-display region NDA. The display region DA may have various shapes. For example, the display region DA may be provided in various shapes, such as a closed-shape polygon including linear sides, a circle, an ellipse, etc., including curved sides, and a semicircle, a semi-ellipse, etc., including linear and curved sides. In this manner, the display region DA may include polygonal and/or free-form (or irregular) shapes (or contours). When the display region DA includes a plurality of regions, each region may also be provided in various shapes, such as a closed-shape polygon including linear sides, a circle, an ellipse, etc., including curved sides, and a semicircle, a semi-ellipse, etc., including linear and curved sides. In addition, areas of the plurality of regions may be equal to or different from one another. For convenience, a case where the display region DA is provided as one region having a quadrangular shape including linear sides is described and illustrated as an example.

The non-display region NDA may be provided at, at least one side of the display region DA. In some exemplary embodiments, the non-display region NDA may surround the circumference of the display region DA. In an exemplary embodiment, the non-display region NDA may include a lateral part extending in the first direction DR1 and a longitudinal part extending in the second direction DR2. The longitudinal part of the non-display region NDA may be provided as a pair of longitudinal parts spaced apart from each other along, for instance, the width direction of the display region DA.

The display region DA may include a plurality of pixel regions in which a plurality of pixels PXL are provided. As will become more apparent below, a pad unit (or area) provided with pads of lines and a data driver DDV that provides a data signal to the pixels PXL are provided in the non-display region NDA. The data driver DDV may provide the data signal to the respective pixels PXL through data lines (not shown). Here, the data driver DDV may be disposed at a lateral part of the non-display region NDA, and extend long along the width direction of the non-display region NDA. For convenience, a scan driver, an emission driver, and a timing controller are not illustrated in FIG. 2, but the timing controller, the emission driver, and the scan driver may also be provided in the non-display region NDA or may be connected to the non-display region NDA.

The first base substrate SB1 may be made of various materials, e.g., glass, polymer, metal, and/or the like. For instance, the first base substrate BS1 may be an insulative substrate made of a polymer organic material. The material of the insulative substrate including the polymer organic material, may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the first base substrate BS1 is not limited thereto or thereby. For example, the first base substrate BS1 may be made of a fiber reinforced plastic (FRP), carbon nanotubes, etc. To this end, the first base substrate BS1 may have a singular or multilayer configuration. In a multilayer configuration, some layers of the first base substrate BS1 may be different than other layers of the first base substrate BS1.

The first base substrate BS1 may include a plurality of signal lines (not shown) connected to the plurality of pixels PXL and a plurality of thin film transistors (not shown)

connected to the plurality of signal lines. For instance, the signal lines may form data lines, scan lines, emission lines, etc.

As will become more apparent below, each of the plurality of pixels PXL may be an organic light emitting device including an organic layer. However, exemplary embodiments are not limited thereto or thereby, and each of the plurality of pixels PXL may be implemented in various forms, such as a liquid crystal device, an electrophoretic device, an electrowetting device, etc. The plurality of pixels PXL may be provided in (or overlapping) the display region DA of the first base substrate BS1. Each pixel PXL may be considered a minimum unit that displays an image, and may be provided in plurality. The pixel PXL may include an organic light emitting device that emits white light and/or colored light. The pixel PXL may emit light of any one color among red, green, and blue; however, exemplary embodiments are not limited thereto or thereby. For instance, the pixel PXL may emit light of any one color among cyan, magenta, yellow, and the like. It is also contemplated that the pixel PXL may be configured to emit light of different colors. The pixel PXL may include a thin film transistor (not shown) connected to the plurality of signal lines (not shown), and the organic light emitting device connected to the thin film transistor. The pixel PXL, the plurality of signal lines, and the plurality of thin film transistors will be described later.

The touch sensor 200 may be provided on a surface on which an image of the display panel 100 is displayed. In some exemplary embodiments, the touch sensor 200 may be integrally provided with the display panel 100, e.g., inside the display panel 100. For convenience, a case where the touch sensor 200 is provided on a surface (e.g., top surface) of the display panel 100 is described and illustrated. The top surface may be considered a surface furthest away from the first base substrate BS1.

The touch sensor 200 may include a second base substrate BS2 including the sensing region SA and the peripheral region PA.

The second base substrate BS2 may be made of an insulative material having flexibility. Here, the second base substrate BS2 may be provided in a shape substantially identical to that of the first base substrate BS1, but exemplary embodiments are not limited thereto or thereby. For instance, the second base substrate BS2 may have an area equal to or larger than that of the first base substrate BS1.

The sensing region SA corresponds to the display region DA of the display panel 100, and may be provided in a shape identical to that of the display region DA, but exemplary embodiments are not limited thereto or thereby. The peripheral region PA may be disposed adjacent to the sensing region SA. Also, the peripheral region PA may correspond to the non-display region NDA of the display panel 100, and may include at least one lateral part and at least one longitudinal part.

The touch sensor 200 may include a touch sensing unit (or touch sensor) provided in the sensing region SA, a line unit (or lines) provided in the peripheral region PA, and a touch sensor pad unit (or touch sensor pads) connected to the line unit.

The touch sensing unit may recognize a touch event with the display device through a hand of a user or a separate input means, e.g., stylus, etc. In some exemplary embodiments, the touch sensing unit may be driven according to a mutual capacitance method. In the mutual capacitance method, a change in capacitance, caused by an interaction between two sensing electrodes, is sensed. In some exemplary embodiments, the touch sensing unit may be driven according to a self-capacitance method. In the self-capacitance method, when a user touches a region, a change in capacitance of a sensing electrode in the touched region is sensed using sensing electrodes arranged in a matrix shape and sensing lines connected to the respective sensing electrodes.

The touch sensing unit may include a touch sensor SR provided in the sensing region SA, sensing lines SL connected to the touch sensor SR, and a touch sensor pad unit TP connected to end portions of the sensing lines SL.

When a touch of a user is applied to (or with respect to) the display device, the touch sensor SR is used to sense the touch of the user and/or a pressure of the touch, and may be provided in the sensing region SA. When viewed on a plane, e.g., in a view normal to a surface of the second base substrate BS2, the touch sensor SR may correspond to the display region DA.

The touch sensor SR may include a plurality of first sensing units SR1 that extend in the first direction DR1 of the second base substrate BS2 and is applied with a sensing voltage, and a plurality of second sensing units SR2 that extend in the second direction DR2 intersecting the first direction DR1. The first sensing units SR1 may be capacitively coupled to the second sensing units SR2, and the voltage of the first sensing units SR1 may be changed by the capacitive coupling.

Each first sensing unit SR1 may include a plurality of first sensing electrodes SSE1 arranged in the first direction DR1 and a plurality of first bridges BR1 through which adjacent first sensing electrodes SSE1 are connected to each other. The first sensing electrodes SSE1 may be provided in various shapes, e.g., a bar shape, a polygonal shape including a quadrangular shape, such as a diamond, etc. In some exemplary embodiments, the first sensing electrodes SSE1 and the first bridges BR1 may be provided as a whole plate shape or may be provided in the shape of a mesh including fine lines.

Each second sensing unit SR2 may include a plurality of second sensing electrodes SSE2 arranged in the second direction DR2 and a plurality of second bridges BR2 through which adjacent second sensing electrodes SSE2 are connected to each other. The second sensing electrodes SSE2 may be provided in various shapes, e.g., a bar shape, a polygonal shape including a quadrangular shape, such as a diamond, etc. In some exemplary embodiments, the second sensing electrodes SSE2 and the second bridges BR2 may be provided as a whole plate shape or may be provided in the shape of a mesh including fine lines.

The first sensing electrodes SSE1 and the second sensing electrodes SSE2 may be alternately arranged in a matrix form on the second base substrate SB2.

The first sensing electrodes SSE1 and the second sensing electrodes SSE2 may be insulated from each other. For instance, as seen in FIG. 3, the first bridges BR1 and the second bridges BR2 intersect each other; however, the first bridges BR1 and the second bridges BR2 may be insulated from each other with an insulating layer (not shown) interposed therebetween, as will become more apparent below. The first sensing unit SR1 and the second sensing unit SR2 may be provided on different layers, but exemplary embodiments are not limited thereto or thereby. In some exemplary embodiments, the first sensing electrodes SSE1 and the second sensing electrodes SSE2 may be provided on the same layer, and the first bridges BR1 and the second bridges BR2 may be provided on different layers.

The sensing lines SL are used to connect the touch sensor SR to a driver (not shown) that drives the touch sensor SR, and may be provided in the peripheral region PA. The driver may be provided on the first base substrate BS1 of the display panel 100 or be provided at the outside, e.g., on a separate printed circuit board or the like. The driver may include a position detection circuit. The sensing lines SL may transmit a sensing input signal from the driver to the first sensing units SR1 and the second sensing units SR2, or transmit sensing output signals from the first sensing units SR1 and the second sensing units SR2 to the driver.

In some exemplary embodiments, the sensing lines SL may include a plurality of first sensing lines SL1 and a plurality of second sensing lines SL2.

The first sensing lines SL1 may be connected to the first sensing units SR1. Each first sensing line SL1 may be connected to a corresponding row of the first sensing units SR1. When viewed on a plane, the first sensing lines SL1 may be bent plural times in the peripheral region PA, and extend along the second direction DR2. As seen in FIG. 3, the first sensing lines SL1 may be provided in a right longitudinal part of the peripheral region PA to be connected to corresponding rows of the first sensing units SR1. In some exemplary embodiments, the first sensing lines SL1 may be provided in a left longitudinal part of the peripheral region PA and/or the right longitudinal part of the peripheral region.

The second sensing lines SL2 may be connected to the second sensing units SR2. Each second sensing line SL2 may be connected to a corresponding column of the second sensing units SR2. When viewed on a plane, the second sensing lines SL2 may be bent plural times in the peripheral region PA, and extend along the first direction DR1. As seen in FIG. 3, the second sensing lines SL2 may be provided in a lower lateral part of the peripheral region PA to be connected to corresponding columns of the second sensing units SR2. In some exemplary embodiments, the second sensing lines SL2 may be provided in an upper lateral part of the peripheral region PA and/or the lower lateral part of the peripheral region PA.

The touch sensor pad unit TP may be a component provided to transmit a signal to the driver between the touch sensor SR and the driver or to transmit a signal to the touch sensor SR. The touch sensor pad unit TP is provided in the peripheral region PA, and may be connected to end portions of the sensing lines SL. The touch sensor pad unit TP may be connected to pad units (not shown) of the display panel 100 through a conductive member (not shown), etc.

In some exemplary embodiments, the touch sensor pad unit TP may include a first touch sensor pad unit TP1 connected to end portions of the first sensing lines SL1 and a second touch sensor pad unit TP2 connected to end portions of the second sensing lines SL2. When viewed on a plane, the first touch sensor pad unit TP1 and the second touch sensor pad unit TP2 may be provided in the peripheral region PA to be adjacent to each other and be spaced apart from each other at a certain distance. In some exemplary embodiments, the first touch sensor pad unit TP1 and the second touch sensor pad unit TP2 may be provided in the peripheral region PA to be spaced apart from each other, but exemplary embodiments are not limited thereto or thereby. For example, the first touch sensor pad unit TP1 and the second touch sensor pad unit TP2 may be implemented as one touch sensor pad unit in the peripheral region PA.

According to some exemplary embodiments, the touch sensor SR, the sensing lines SL, and the touch sensor pad unit TP may be made of a conductive material. The conductive material may include at least one of a metal, any alloy thereof, a conductive polymer, a conductive metal oxide, a nano-conductive material, and the like. In some exemplary embodiments, examples of the metal may be copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like. Examples of the conductive polymer may be polythiophene-based, polypyrrole-based, polyaniline-based, polyacetylene-based, and polyphenylene-based compounds, mixtures thereof, and the like. In particular, a PEDOT/PSS compound among the polythiophene-based compounds may be used as the conductive polymer. Examples of the conductive metal oxide may be indium tin oxide (ITO), indium zinc oxide (IZO), antimony zinc oxide (AZO), indium tin zinc oxide (ITZO), zinc oxide (ZnO), tin oxide (SnO2), and the like. In addition, examples of the nano-conductive compound may be silver nanowire (AgNW), carbon nano tube (CNT), graphene, and the like.

Figure 4:
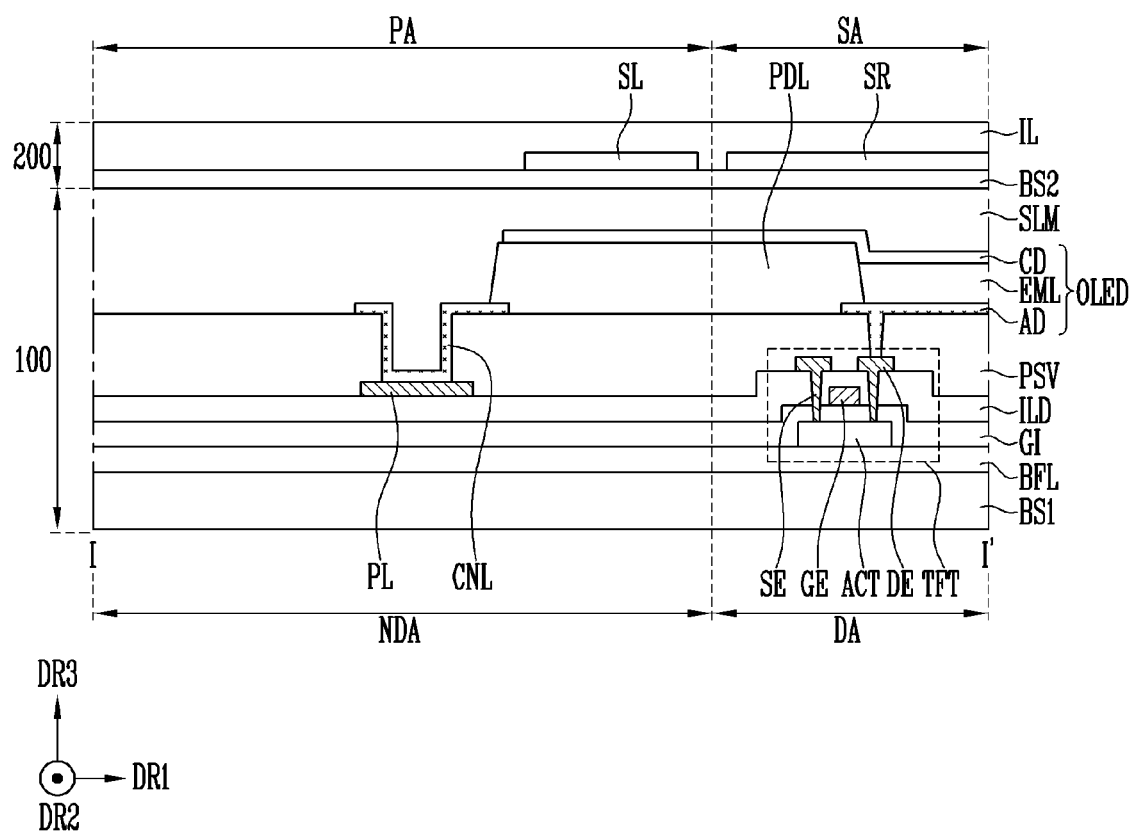
FIG. 4 is a sectional view taken along sectional line I-I' of FIG. 1 according to some exemplary embodiments.

FIG. 4 is a sectional view taken along sectional line I-I' of FIG. 1 according to some exemplary embodiments.

Referring to FIGS. 1 and 4, the display device may include a display panel 100 and a touch sensor 200. The display panel 100 may include a first base substrate BS1, a thin film transistor TFT provided on the first base substrate BS1, and a light emitting device OLED connected to the thin film transistor TFT. The touch sensor 200 may include a second base substrate BS2, and a sensing line SL, and a touch sensor SR, which are provided on the second base substrate BS2. Hereinafter, the display device will be described according to a stacking order of the various elements. For convenience, the display panel 100 will be first described, and the touch sensor 200 will be then described.

The first base substrate BS1 may include a display region DA and a non-display region NDA provided at a side of the display region DA. Here, the thin film transistor TFT and the light emitting device OLED may be provided in (e.g., overlapping) the display region DA, and a power line PL may be provided in the non-display region NDA. For convenience, the display region DA will be first described.

A buffer layer BFL may be provided on the first base substrate BS1. The buffer layer BFL may prevent impurities from being diffused into the thin film transistor TFT provided on the first base substrate BS1, and improve the flatness of the first base substrate BS1. The buffer layer BFL may be provided as a single layer, but may be formed as a multi-layer structure including at least two layers. The buffer layer BFL may be an inorganic insulating layer made of an inorganic material. For example, the buffer layer BFL may be formed of silicon nitride, silicon oxide, silicon oxynitride, or the like. When the buffer layer BFL is provided as the multi-layer structure, the layers may be formed of the same material or different materials. The buffer layer BFL may be omitted.

An active pattern ACT may be provided on the buffer layer BFL. The active pattern ACT may be formed of a semiconductor material. The active pattern ACT may include a source region, a drain region, and a channel region provided between the source region and the drain region. The active pattern ACT may be a semiconductor pattern made of poly-silicon, amorphous silicon, semiconductor oxide, or the like. The channel region is a semiconductor pattern undoped with impurities, and may be an intrinsic semiconductor. The source region and the drain region may be semiconductor patterns doped with impurities.

A gate insulating layer GI is disposed on the buffer layer BFL having the active pattern ACT provided thereon. The gate insulating layer GI may be an inorganic insulating layer including an inorganic material. Alternatively, the gate insulating layer GI may be an organic insulating layer including an organic material.

A gate electrode GE may be provided on the gate insulating layer GI. The gate electrode GE may be formed to cover (or overlap) a region corresponding to the channel region of the active pattern ACT. The gate electrode GE may be made of a metal. For example, the gate electrode GE may be made of at least one of metals, such as gold (Au), silver (Ag), aluminum (Al), molybdenum (Mo), chromium (Cr), titanium (Ti), nickel (Ni), neodymium (Nd), and copper (Cu), or alloys thereof. In addition, the gate electrode GE may be formed in a single layer, but exemplary embodiments are not limited thereto or thereby. For example, the gate electrode GE may be formed as a multi-layer structure in which two or more materials among the metals and the alloys are stacked. In some exemplary embodiments, although not shown in the drawings, a gate line that provides a scan signal to the thin film transistor TFT may be provided in the same layer as the gate electrode GE and include the same material.

An interlayer insulating layer ILD is provided on the gate insulating layer GI having the gate electrode GE provided thereon. The interlayer insulating layer ILD may be an inorganic insulating layer including an inorganic material. The inorganic material may include polysiloxane, silicon nitride, silicon oxide, silicon oxynitride, and the like.

A source electrode SE and a drain electrode DE may be provided on the interlayer insulating layer ILD. The source electrode SE and the drain electrode DE may be connected to the source region and the drain region of the active pattern ACT through contact holes sequentially passing through the interlayer insulating layer ILD and the gate insulating layer GI, respectively. The source electrode SE and the drain electrode DE may be made of a metal. For example, the source electrode SE and the drain electrode DE may be made of at least one of metals such as gold (Au), silver (Ag), aluminum (Al), molybdenum (Mo), chromium (Cr), titanium (Ti), nickel (Ni), neodymium (Nd), and copper (Cu), or alloys thereof. In addition, the source electrode SE and the drain electrode DE may be formed in a single layer, but exemplary embodiments are not limited thereto or thereby. For example, the source electrode SE and the drain electrode DE may be formed as a multi-layer structure in which two or more materials among the metals and the alloys are stacked.

In some exemplary embodiments, the thin film transistor TFT may include the active pattern ACT, the gate electrode GE, the source electrode SE, and the drain electrode DE. A case where the thin film transistor TFT is a thin film transistor having a top gate structure is illustrated as an example, but exemplary embodiments are not limited thereto or thereby. For example, the thin film transistor TFT may be a thin film transistor having a bottom gate structure, a dual gate structure, etc.

A protective layer PSV that covers the thin film transistor TFT may be provided on the interlayer insulating layer ILD on which the source electrode SE and the drain electrode DE are provided. The protective layer PSV may be an organic insulating layer including an organic material. Examples of the organic material may be organic insulating materials including a polyacryl-based compound, a polyimide-based compound, a fluorine-based compound, such as Teflon, a benzocyclobutene-based compound, and the like.

The light emitting device OLED may be provided on the protective layer PSV. The light emitting device OLED may include a first electrode AD, an emitting layer EML provided on the first electrode AD, and a second electrode CD provided on the emitting layer EML. The first electrode AD is provided on the protective layer PSV, and may be connected to the drain electrode DE through a contact hole passing through the protective layer PSV.

A pixel defining layer PDL may be provided on the first electrode AD. The pixel defining layer PDL may allow a region corresponding to a light emitting region of each pixel (see, e.g., PXL of FIG. 2) to be exposed therethrough. For example, the pixel defining layer PDL may allow a top surface of the first electrode AD to be exposed therethrough, and protrude from the protective layer PSV along the circumference of each pixel PXL.

The emitting layer EML may be provided on the first electrode AD exposed by the pixel defining layer PDL. The second electrode CD may be provided on the emitting layer EML. The first electrode AD may be an anode electrode and the second electrode CD may be a cathode electrode. In addition, when the light emitting device OLED is a top-emission light emitting device, the first electrode AD may be a reflective electrode, and the second electrode CD may be a transmissive electrode.

As described above, when the first electrode AD is the anode electrode and the reflective electrode, the first electrode AD may include a reflective layer (not shown) and a transparent conductive layer (not shown) disposed on the top or bottom of the reflective layer. At least one of the transparent conductive layer and the reflective layer may be connected to the drain electrode DE.

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), a siloxane based resin, and a silane based resin.

The emitting layer EML may have a multi-layered thin film structure including a light generation layer that generates colored light or white light. The second electrode CD may be provided on the emitting layer EML. The second electrode CD may extend from display region DA to a partial region of the non-display region NDA.

An encapsulation layer SLM may be provided over the second electrode CD. The encapsulation layer SLM may prevent (or reduce) oxygen and moisture from penetrating into the light emitting device OLED.

The non-display region NDA of the first base substrate BS1 will now be described according to a stacking order.

The buffer layer BFL, the gate insulating layer GI, and the interlayer insulating layer ILD may be sequentially provided on the first base substrate BS1. The power line PL for driving the thin film transistor TFT and the light emitting device OLED may be provided on the interlayer insulating layer ILD. The protective layer PSV may be provided over the power line PL. A connection line CNL may be provided on the protective layer PSV. The connection line CNL may be connected to the power line PL through a contact hole passing through the protective layer PSV. The pixel defining layer PDL may be provided on the connection line CNL. In addition, the encapsulation layer SLM may be provided over (e.g., covering) the pixel defining layer PDL.

Hereinafter, the touch sensor 200 will be described according to a stacking order.

The second base substrate BS2 including a sensing region SA and a peripheral region PA may be provided on the encapsulation layer SLM.

The touch sensor SR and the sensing line SL may be provided on the second base substrate BS2. The touch sensor SR may be provided in (e.g., overlapping) the sensing region SA of the second base substrate BS2, and the sensing line SL may be provided in the peripheral region PA of the second base substrate BS2. The sensing line SL may be provided on the peripheral region PA to correspond to a portion of the second electrode CD of the light emitting device OLED. For example, the sensing line SL may be disposed on the second electrode CD to cover a portion of the second electrode CD, and, thereby, overlap with a portion of the second electrode CD.

An insulating layer IL may be provided over the touch sensor SR and the sensing line SL. The insulating layer IL may function to protect the touch sensor SR and the sensing line SL from the outside.

In some exemplary embodiments, the portion of the second electrode CD, which overlaps with the sensing line SL, may be an interference prevention layer that prevents (or reduces) voltages applied to the display panel 100 from interfering with sensing inputs and/or output signals, applied to the sensing line SL. The sensing inputs and/or the output signals, applied to the sensing line SL, may be signals for sensing a touch event in the sensing region SA.

In some cases, the sensing inputs and/or the output signals, applied to the sensing line SL, may be distorted while including noise due to influence of voltages applied to the display panel 100, e.g., a data signal, a scan signal, an emission control signal, first and second driving voltages, and the like, to be provided to the touch sensor SR. In these cases, it may be difficult for the touch sensor 200 to detect an accurate touch event. According to some exemplary embodiments, however, the sensing line SL may be disposed in the peripheral region PA to overlap with a portion of the second electrode CD when viewed on a plane, so that the interference caused by the voltages applied to the display device 100 can be blocked by the second electrode CD. In this manner, the sensing inputs and/or the output signals, applied to the sensing line SL, are not distorted.

Figure 5:
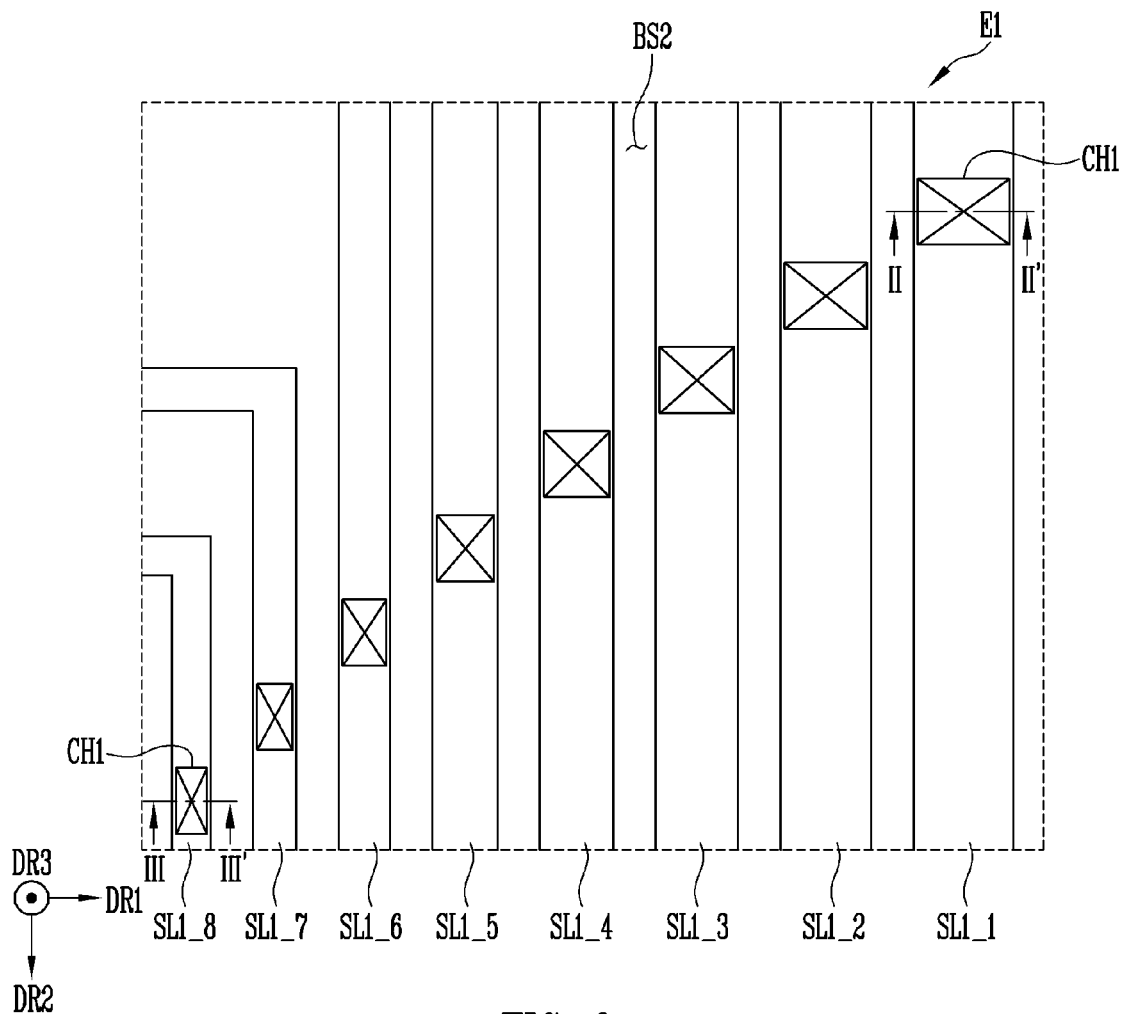
FIG. 5 is an enlarged plan view of portion E1 of the touch sensor of FIG. 3 according to some exemplary embodiments.
Figure 6:
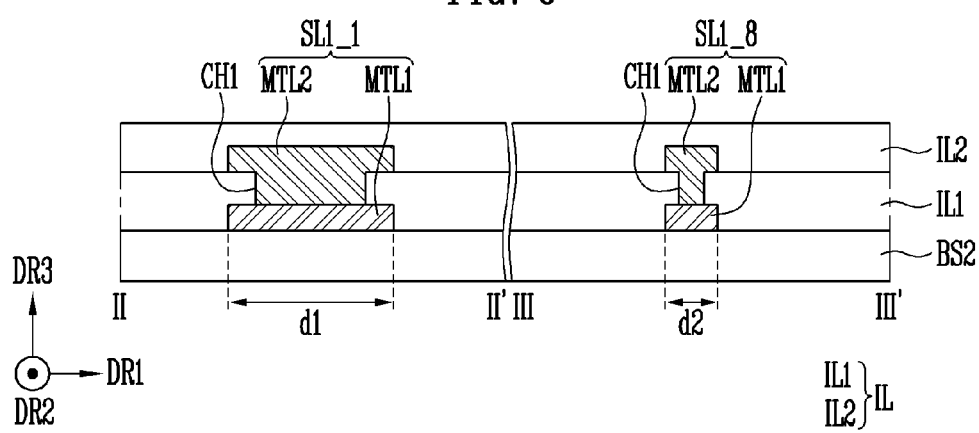
FIG. 6 is a sectional view taken along sectional lines II-II' and III-III' of FIG. 5 according to some exemplary embodiments.

FIG. 5 is an enlarged plan view of portion E1 of the touch sensor of FIG. 3 according to some exemplary embodiments. FIG. 6 is a sectional view taken along sectional lines II-II' and III-III' of FIG. 5 according to some exemplary embodiments.

Referring to FIGS. 3, 5, and 6, first sensing lines SL1 may be provided in the peripheral region PA of the second base substrate BS2, and extend toward the first touch sensor pad unit TP1 along the second direction DR2 of the second base substrate BS2 from first sensing electrodes SSE1.

The first sensing lines SL1 may include (1-1)th to (1-8)th sensing lines SL1_1, SL1_2, SL1_3, SL1_4, SL1_5, SL1_6, SL1_7, and SL1_8. Line widths of the (1-1)th to (1-8)th sensing lines SL1_1, SL1_2, SL1_3, SL1_4, SL1_5, SL1_6, SL1_7, and SL1_8 may be different from one another. For example, the line width of the (1-8)th sensing line SL1_8 most adjacent to the sensing region SA may be relatively narrow, and the line width of the (1-1)th sensing line SL1_1 most distant from the sensing region SA may be relatively wide. That is, the line width of each of the first sensing lines SL1 may be narrowed as the first sensing line SL1 becomes more adjacent to the sensing region SA.

The line widths of the first sensing lines SL1 are designed different from one another so as to allow line resistance values of the first sensing lines SL1 to be uniform (or substantially uniform). That is, in some exemplary embodiments, the line widths of the first sensing lines SL1 are designed different from one another, so that the first sensing lines SL1 can be implemented to have the same (or substantially the same) resistance value.

According to various exemplary embodiments, the (1-1)th sensing line SL1_1 is located at an outermost portion of the peripheral region PA, which is most distant from the sensing region SA, and may be connected to the first sensing electrodes SSE1 disposed on a row most distant from the first touch sensor pad unit TP1. On the other hand, the (1-8)th sensing line SL1_8 is located in the peripheral region PA to be most adjacent to the sensing region SA, and may be connected to the first sensing electrodes SSE1 on a row closest to the first touch sensor pad unit TP1. Therefore, the (1-1)th sensing line SL1_1 may have a line length longer than that of the (1-8)th sensing line SL1_8.

In general, a line resistance value is in proportion to a line length. When the (1-1)th sensing line SL1_1 and the (1-8)th sensing line SL1_8 have the same line width, the line resistance value of the (1-1)th sensing line SL1_1 having a relatively long line length may be greater than that of the (1-8)th sensing line SL1_8 having a relatively short line length. The difference in line resistance value between the (1-1)th sensing line SL1_1 and the (1-8)th sensing line SL1_8 may differently distort sensing input signals respectively applied to the (1-1)th sensing line SL1_1 and the (1-8)th sensing line SL1_8. When a uniform sensing input signal is not provided to the whole of the sensing region SA, the touch recognition rate of the touch sensor 200 may be degraded. In order to prevent (or reduce) these differences, in some exemplary embodiments, the widths of the first sensing lines SL1 are designed different from one another, so that the line resistance values of the first sensing lines SL1 can be uniform, thereby improving the touch recognition rate of the touch sensor 200.

Each of the first sensing lines SL1 may include a first contact hole CH1. For convenience, it is illustrated and described that each of the first sensing lines SL1 includes one first contact hole CH1, but exemplary embodiments are not limited thereto or thereby. For example, the first contact hole CH1 may be provided in plurality in a corresponding first sensing line SL1. For instance, a plurality of first contact holes CH1 may be spaced apart along the length and/or width of a corresponding first sensing line SL1. The first contact hole CH1 may have a size corresponding to the line width of a corresponding first sensing line SL1. For example, the size of the first contact hole CH1 included in the (1-1)th sensing line SL1_1 having a relatively wide line width may be larger than that of the first contact hole CH1 included in the (1-8)th sensing line SL1_8 having a relatively narrow line width. The size of the first contact hole CH1 is changed to correspond to the line width of each of the first sensing lines SL1, so that contact resistances of the first sensing lines SL1 become uniform.

According to some exemplary embodiments, each of the first sensing lines SL1 may be provided as a double layer, e.g., a multi-layer structure on the second base substrate BS2 so as to have a low resistance. For example, each of the first sensing lines SL1 may include a first metal layer MTL1 provided on the second base substrate BS2 and a second metal layer MTL2 connected to the first metal layer MTL1 through the first contact hole CH1. Here, the first metal layer MTL1 and the second metal layer MTL2 may have the same width when viewed on a plane.

As described above, the line widths of the first sensing lines SL1 are designed different from one another, so that the first sensing lines SL1 can be implemented to have the same resistance. Further, the touch recognition rate of the touch sensor 200 becomes uniform in the whole region of the touch sensor 200, so that a touch event of a user can be accurately recognized.

Hereinafter, the first sensing lines SL1 will be described according to a stacking order with reference to FIG. 6.

Referring to FIG. 6, a first metal layer MTL1 may be provided on the second base substrate BS2. The first metal layer MTL1 may be made of a conductive material. The conductive material may include a metal, any alloy thereof, a conductive polymer, a conductive metal oxide, a nano-conductive material, and the like. In some exemplary embodiments, examples of the metal may be at least one of copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like. Examples of the conductive polymer may be polythiophene-based, polypyrrole-based, polyaniline-based, polyacetylene-based, and polyphenylene-based compounds, mixtures thereof, and the like. For instance, a PEDOT/PSS compound among the polythiophene-based compounds may be used as the conductive polymer. Examples of the conductive metal oxide may be indium tin oxide (ITO), indium zinc oxide (IZO), antimony zinc oxide (AZO), indium tin zinc oxide (ITZO), zinc oxide (ZnO), tin oxide (SnO2), and/or the like. In addition, examples of the nano-conductive compound may be silver nanowire (AgNW), carbon nano tube (CNT), graphene, and/or the like.

A first insulating layer IL1 may be provided over the first metal layer MTL1. The first insulating layer IL1 may be an inorganic insulating layer including an inorganic material or be an organic insulating layer including an organic material. Examples of the inorganic material may be inorganic insulating materials including polysiloxane, silicon nitride, silicon oxide, silicon oxynitride, and/or the like. Examples of the organic material may be organic insulating materials including a polyacryl-based compound, a polyimide-based compound, a fluorine-based compound, such as Teflon, a benzocyclobutene-based compound, and/or the like.

A second metal layer MTL2 may be provided on the first insulating layer MTL1. The second metal layer MTL2 may be made of the same material as the first metal layer MTL1. The first metal layer MTL1 and the second metal layer MTL2 may have the same width with the first insulating layer IL1 interposed therebetween. Here, the width d1 of the first metal layer MTL1 and the second metal layer MTL2 of the (1-1)th sensing line SL1_1 may be wider than the width d2 of the first metal layer MTL1 and the second metal layer MTL2 of the (1-8)th sensing line SL1_8.

A second insulating layer IL2 may be provided over the second metal layer MTL2. The second insulating layer IL2 may cover the first sensing lines SL1 and allow the first sensing lines SL1 to be electrically insulated from each other.

The first insulating layer IL1 and the second insulating layer IL2 may constitute the insulating layer (see, e.g., IL of FIG. 4) of the touch sensor 200.

Figure 7:
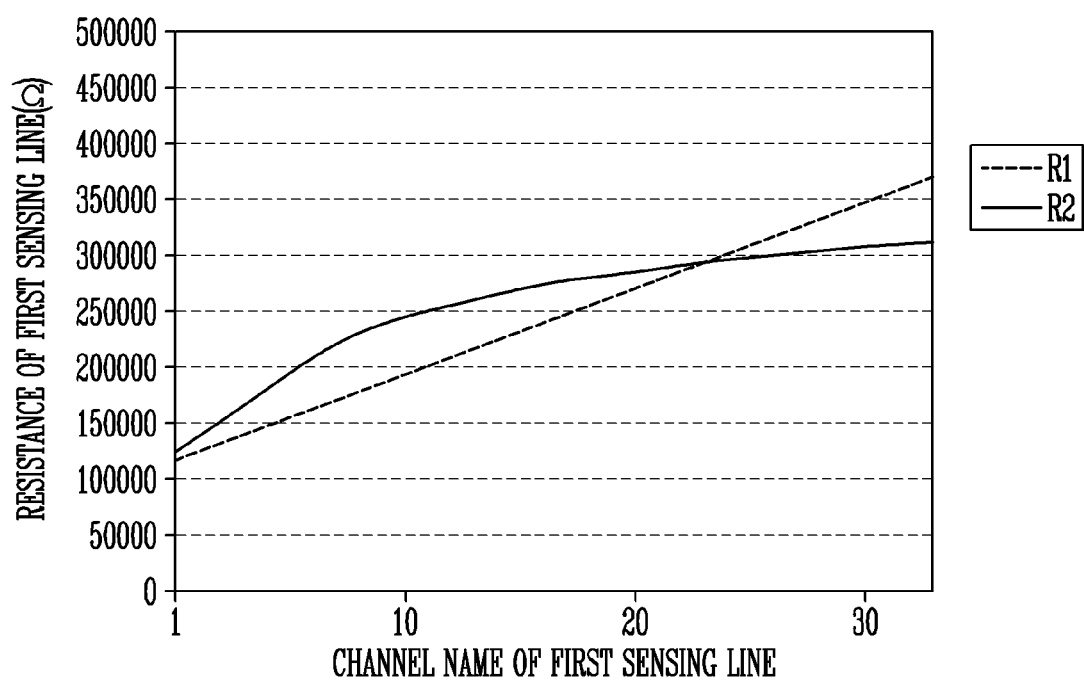
FIG. 7 is a graph comparing line widths and resistances of first sensing lines according to some exemplary embodiments.

FIG. 7 is a graph comparing line widths and resistances of first sensing lines according to some exemplary embodiments.

In FIG. 7, R1 shows line resistance characteristics of 33 first sensing lines when the first sensing lines have the same line width, and R2 shows line resistance characteristics of 33 first sensing lines SL1 when the first sensing lines SL1 have different line widths. In the graph of FIG. 7, number 1 on an X-axis may mean a first sensing line disposed most adjacent to the sensing region SA among the 33 first sensing lines. On the X axis of the graph of FIG. 7, as a number increases from number 1, the number may mean a first sensing line disposed more distant from the sensing region SA.

Referring to FIG. 7, it can be seen that, when the first sensing lines SL1 have different line widths, the line resistance values of the first sensing lines become more uniform.

For example, as shown in association with R1, it can be seen that the line resistance value of each of the first sensing lines increases as the first sensing line is disposed more distant from the sensing region SA. This is because the line length of each of the first sensing lines increases as the first sensing line becomes more distant from the sensing region SA, and, hence, there occurs a difference in line resistance value between the first sensing lines.

However, as shown in association with R2, it can be seen that, although each of the first sensing lines SL1 having different line widths is disposed distant from the sensing region SA, the line resistance values of the first sensing lines SL1 become more uniform as compared with R1. This is because each of the first sensing lines SL1 is designed to have a line width that is in reverse proportion to the line length of the first sensing line SL1.

Figure 8:
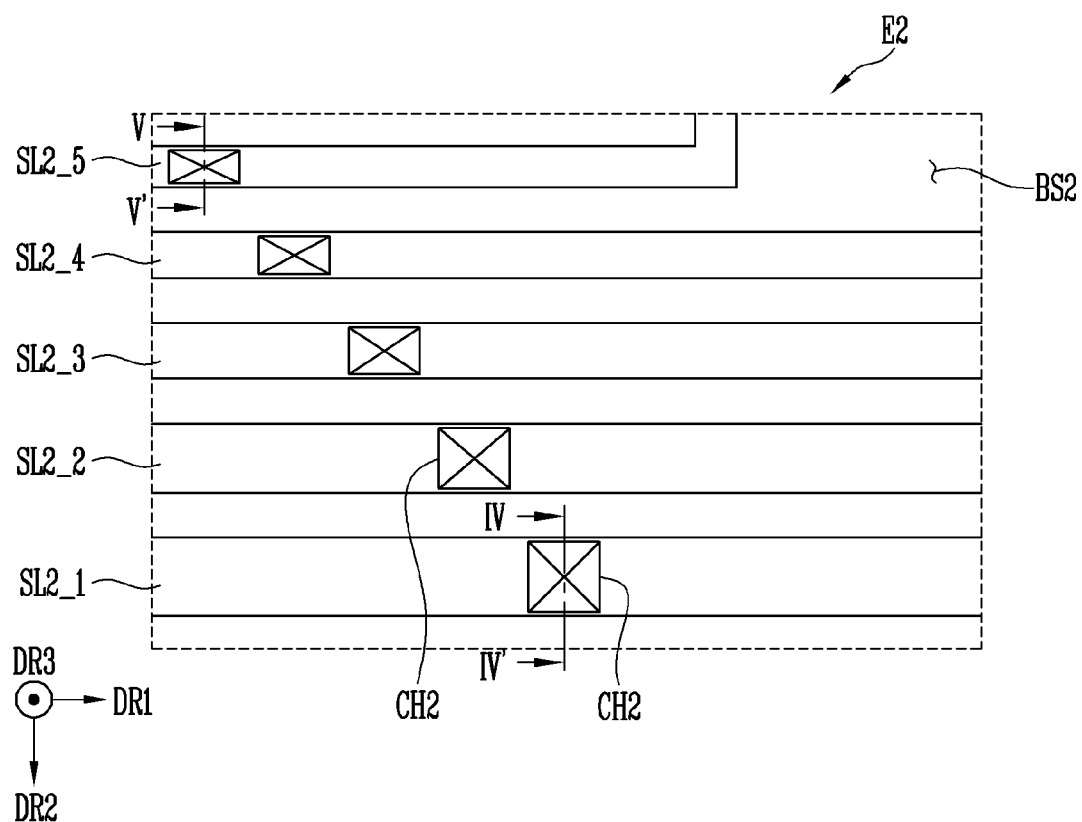
FIG. 8 is an enlarged plan view of portion E2 of the touch sensor of FIG. 3 according to some exemplary embodiments.
Figure 9:
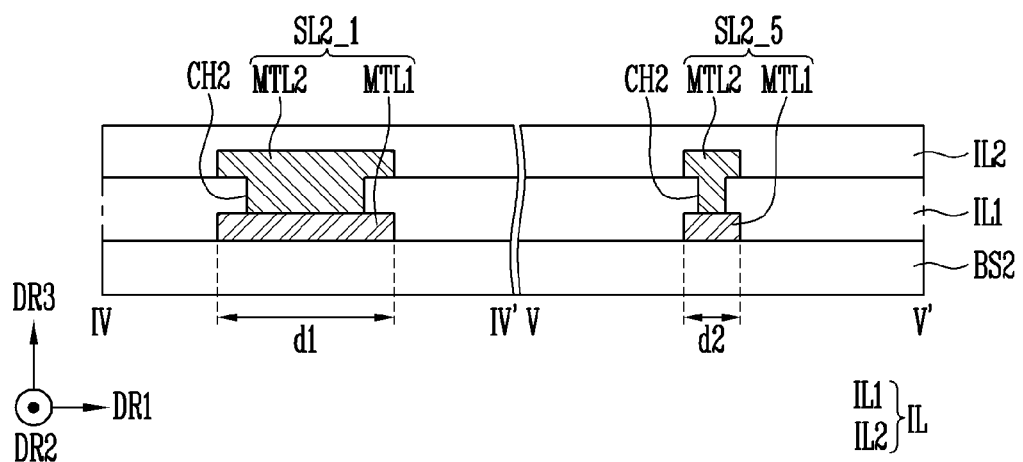
FIG. 9 is a sectional view taken along sectional lines IV-IV' and V-V' of FIG. 8 according to some exemplary embodiments.

FIG. 8 is an enlarged plan view of portion E2 of the touch sensor of FIG. 3 according to some exemplary embodiments. FIG. 9 is a sectional view taken along sectional lines IV-IV' and V-V' of FIG. 8 according to some exemplary embodiments.

Referring to FIGS. 3, 8, and 9, second sensing lines SL2 may be provided in the peripheral region PA of the second base substrate BS2, and extend toward the second touch sensor pad unit TP2 along the second direction DR2 of the second base substrate BS2 from second sensing electrodes SSE2.

The second sensing lines SL2 may include (2-1)th to (2-5)th sensing lines SL2_1, SL2_2, SL2_3, SL2_4, and SL2_5. The (2-1)th to (2-5)th sensing lines SL2_1, SL2_2, SL2_3, SL2_4, and SL2_5 may have different line widths. For example, the line width of the (2-5)th sensing line SL2_5 most adjacent to the sensing region SA may be relatively narrow, and the line width of the (2-1)th sensing line SL2_1 may be relatively wide. That is, the line width of each of the second sensing lines SL2 may become narrower as the second sensing line SL2 becomes more adjacent to the sensing region SA.

The line widths of the second sensing lines SL2 are designed different from one another so as to allow line resistance values of the second sensing lines SL2 to become uniform (or substantially uniform). That is, in some exemplary embodiments, the line widths of the second sensing lines SL2 are designed different from one another, so that the second sensing lines SL2 can be implemented to have the same (or substantially the same) resistance.

Each of the second sensing lines SL2 may include a second contact hole CH2. For convenience, it is described and illustrated that each of the second sensing lines SL2 includes one second contact hole CH2, but exemplary embodiments are not limited thereto or thereby. For example, the second contact hole CH2 may be provided in plurality in a corresponding second sensing line SL2. For instance, a plurality of second contact holes CH2 may be spaced apart along the length and/or width of a second sensing line SL2.

The second contact hole CH2 may have a size corresponding to the line width of a corresponding second sensing line SL2. For example, the size of the second contact hole CH2 included in the (2-1)th sensing line SL2_1 having a relatively wide line width may be larger than that of the second contact hole CH2 included in the (2-5)th sensing line SL2_5 having a relatively narrow line width.

Like the first sensing lines SL1, each of the second sensing lines SL2 may be formed as a multi-layer structure on the second base substrate BS2 so as to have a low resistance. For example, each of the second sensing lines SL2 may include a first metal layer MTL1 provided on the second base substrate BS2 and a second metal layer MTL2 connected to the first metal layer MTL1 through the second contact hole CH2 passing through a first insulating layer IL1. The first metal layer MTL1 and the second metal layer MTL2 may have the same width when viewed on a plane. The width d1 of the first metal layer MTL1 and the second metal layer MTL2 of the (2-1)th sensing line SL2_1 may be wider than width d2 of the first metal layer MTL1 and the second metal layer MTL2 of the (2-5)th sensing line SL2_5.

Figure 10:
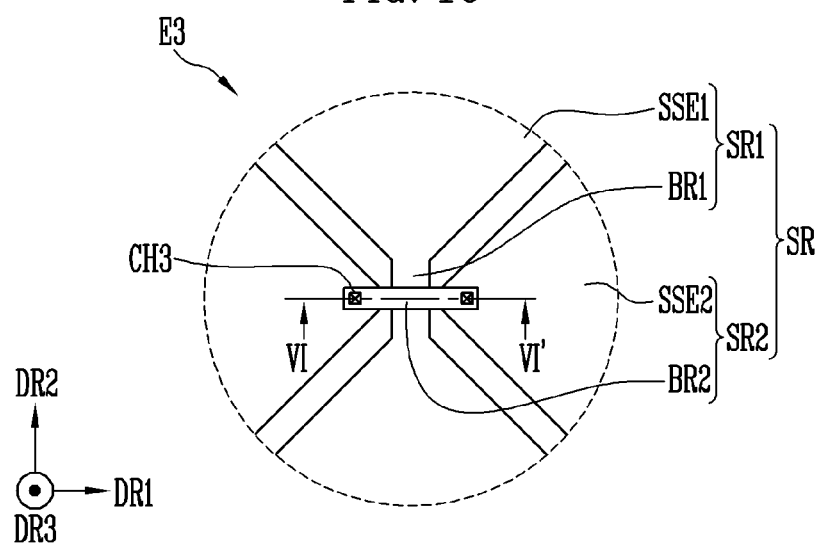
FIG. 10 is an enlarged plan view of portion E3 of the touch sensor of FIG. 3 according to some exemplary embodiments.
Figure 11:
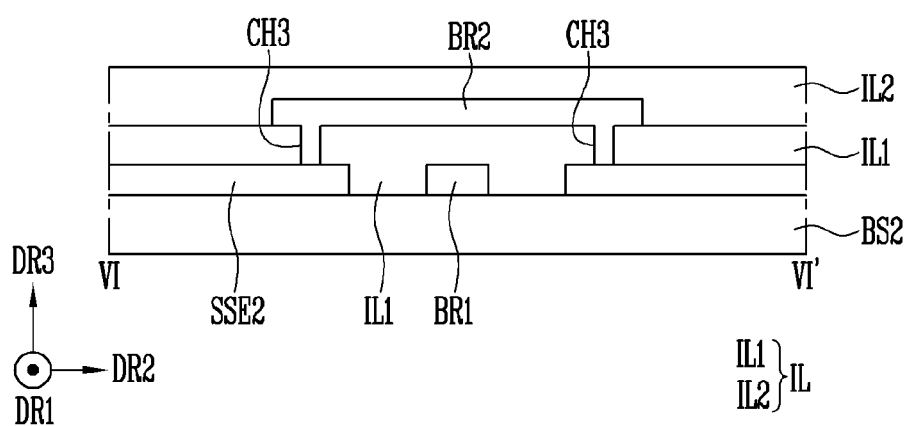
FIG. 11 is a sectional view taken along sectional line VI-VI' of FIG. 10 according to some exemplary embodiments.

FIG. 10 is an enlarged plan view of portion E3 of the touch sensor of FIG. 3 according to some exemplary embodiments. FIG. 11 is a sectional view taken along sectional line VI-VI' of FIG. 10 according to some exemplary embodiments.

Referring to FIGS. 3, 10, and 11, the touch sensor 200 may include a second base substrate BS2, first sensing units SR1, and second sensing units SR2 provided on the second base substrate BS2. The first sensing unit SR1 includes a first sensing electrode SSE1 and a first bridge BR1 that connects adjacent first sensing electrodes SSE1 to each other. The second sensing unit SR1 includes a second sensing electrode SSE2 and a second bridge BR2 that connects adjacent second sensing electrodes SSE2 to each other.

The first sensing electrode SSE1 and the second sensing electrode SSE2 may be provided on the second base substrate BS2 and may be disposed in the same layer. In this case, the first sensing electrode SSE1 and the second sensing electrode SSE2 may be formed as independent patterns that are not connected to each other. Two first sensing electrodes SSE1 adjacent to each other may be connected to each other by the first bridge BR1 disposed in the same layer as the first sensing electrodes SSE1. Two second sensing electrodes SSE2 adjacent to each other may be connected to each other by the second bridge BR2 through third contact holes CH3 passing through the first insulating layer IL1. A second insulating layer IL2 may be provided over the second bridge BR2 and the first insulating layer IL1.

According to various exemplary embodiments, the display device can be employed in various electronic devices. For example, the display device is applicable to televisions, notebook computers, cellular phones, smart phones, smart pads, personal media players, personal digital assistants, navigational devices, various wearable devices, such as smart watches, and the like.

According to various exemplary embodiments, it is possible to provide a touch sensor having a uniform (or substantially uniform) touch recognition rate. Also, according to various exemplary embodiments, it is possible to provide a display device having the touch sensor capable of providing a uniform (or substantially uniform) touch recognition rate.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
a first substrate;
a transistor on the first substrate;
a light emitting device connected to the transistor;
a power line connected to the transistor and the light emitting device;
an encapsulation layer covering the light emitting device; and
a sensor on the encapsulation layer,
wherein the sensor comprises:
sensing electrodes; and
sensing lines connected to the sensing electrodes,
wherein widths of the sensing lines are different from one another,
wherein the light emitting device comprises:
a first electrode connected to the transistor;
an emitting layer on the first electrode; and
a second electrode on the emitting layer, and
wherein, in a direction normal to a surface of the first substrate, the second electrode fully overlaps all portions of the sensing lines such that the second electrode prevents voltages applied to the transistor from interfering with the sensing lines.

2. The display device of claim 1, wherein the sensing electrodes are disposed in a sensing region, and
wherein the widths increase with increasing distance from the sensing region.

3. The display device of claim 2, wherein each of the sensing lines is formed as a multilayer structure,
wherein the multilayer structure comprises:
a first conductive layer; and
a second conductive layer disposed on the first conductive layer with an insulating layer therebetween,
wherein the second conductive layer is connected to the first conductive layer via a contact hole among contact holes of the insulating layer, and
wherein sizes of the contact holes corresponding to the sensing lines increase with increasing distance from the sensing region.

4. The display device of claim 1, wherein each of the sensing electrodes comprises:
a first sensing structure extending along a first direction of the first substrate; and
a second sensing structure extending along a second direction of the first substrate, the second direction intersecting the first direction.

5. The display device of claim 1, wherein resistance values of the sensing lines are equivalent.

6. A display device comprising:
a substrate;
a transistor on the substrate;
a light emitting device connected to the transistor;
a power line connected to the transistor and the light emitting device;
an encapsulation layer covering the light emitting device;
sensing electrodes on the encapsulation layer; and
sensing lines on the encapsulation layer, the sensing lines being connected to the sensing electrodes,
wherein:
each of the sensing lines is formed as a multilayer structure;
in a direction normal to a surface of the substrate, a width of each multilayer structure varies between a first width and a second width different from the first width; and
first widths of the sensing lines are different from one another, wherein the light emitting device comprises:
a first electrode connected to the transistor;
an emitting layer on the first electrode; and
a second electrode on the emitting layer, and
wherein, in the direction normal to the surface of the substrate, the second electrode fully overlaps all portions of the sensing lines such that the second electrode prevents voltages applied to the transistor from interfering with the sensing lines.

7. The display device of claim 6, wherein the sensing electrodes are disposed in a sensing region, and
wherein the first widths increase with increasing distance from the sensing region.

8. The display device of claim 6, wherein:
the multilayer structure comprises:
a first conductive layer;
a second conductive layer on the first \ conductive layer; and
a third conductive layer between the first conductive layer and the second conductive layer;
a width of the third conductive layer forms the second width; and
the second width is smaller than the first width.

9. The display device of claim 8, wherein:
a width of the first conductive layer forms the first width; and
widths of the first conductive layer and the second conductive layer are equivalent.

10. The display device of claim 6, wherein second widths of the sensing lines are different from one another.

* * * * *